(12) United States Patent  
Nguyen

(10) Patent No.: US 7,764,535 B2
(45) Date of Patent: Jul. 27, 2010

(54) LOW POWER, SMALL SIZE SRAM ARCHITECTURE

(75) Inventor: Thu Nguyen, Palo Alto, CA (US)

(73) Assignee: Miradia Inc., Santa Clara, CA (US)

( * ) Notice: Subject to any disclaimer, the term of this patent is extended or adjusted under 35 U.S.C. 154(b) by 152 days.

(21) Appl. No.: 12/137,362

(22) Filed: Jun. 11, 2008

(65) Prior Publication Data

US 2009/0310398 A1 Dec. 17, 2009

(51) Int. Cl.
*G11C 7/00* (2006.01)
(52) U.S. Cl. ............. 365/154; 365/189.02; 365/189.11; 365/189.04; 365/207; 365/230.06
(58) Field of Classification Search ................. 365/154, 365/189.02, 189.11, 189.04, 207, 230.06
See application file for complete search history.

(56) References Cited

U.S. PATENT DOCUMENTS

| 6,563,730 | B1 * | 5/2003 | Poplevine et al. ........... 365/154 |
| 7,022,245 | B2 | 4/2006 | Pan et al. |
| 7,382,513 | B2 | 6/2008 | Yang |
| 7,511,989 | B2 * | 3/2009 | Thomas et al. ............... 365/154 |
| 2005/0057580 | A1 | 3/2005 | Yamano et al. |
| 2005/0083773 | A1 | 4/2005 | Hidaka |
| 2006/0083042 | A1 | 4/2006 | Ma et al. |
| 2007/0097487 | A1 | 5/2007 | Yang |
| 2007/0285843 | A1 | 12/2007 | Tran |

OTHER PUBLICATIONS

International Search Report and Written Opinion of PCT Application No. PCT/US09/46498, mailed Jul. 14, 2009, 8 pages total.

* cited by examiner

*Primary Examiner*—Thong Q Le
(74) *Attorney, Agent, or Firm*—Townsend and Townsend and Crew LLP

(57) ABSTRACT

A memory cell for driving a complementary pair of electrodes associated with a micro-mirror of a spatial light modulator includes two PMOS transistors coupled to a voltage source providing a source voltage. The two PMOS transistors are characterized by a first size. The memory cell also includes two NMOS transistors coupled to ground. Each of the two NMOS transistors are coupled to one of the two PMOS transistors and are characterized by a second size substantially equal to the first size. The memory cell further includes two word line transistors coupled to a word line and characterized by a third size substantially equal to the first size. Power savings associated with the precharge circuit on the order of $(Vdh/Vdl)^2=36$ are achieved in some embodiments.

21 Claims, 7 Drawing Sheets

LOW POWER, SMALL SIZE SRAM ARCHITECTURE

BACKGROUND OF THE INVENTION

This present invention relates generally to spatial light modulators. More particularly, the invention relates to a method and apparatus for providing control circuitry for actuation of mirrors in a spatial light modulator. Merely by way of example, the invention has been applied to a design of addressing circuitry suitable for driving electrodes associated with micro-mirrors in a spatial light modulator used in a display application. The method and apparatus can be applied to spatial light modulators as well as other devices, for example, micro-electromechanical sensors, detectors, and displays.

Spatial light modulators (SLMs) have numerous applications in the areas of optical information processing, projection displays, video and graphics monitors, televisions, and electrophotographic printing. Reflective SLMs are devices that modulate incident light in a spatial pattern to reflect an image corresponding to an electrical or optical input. The incident light may be modulated in phase, intensity, polarization, or deflection direction. A reflective SLM is typically comprised of an area or two-dimensional array of addressable picture elements (pixels) capable of reflecting incident light.

Some conventional SLMs utilize array designs that include an array of micro-mirrors with a set of electrodes and a memory array positioned underneath each of the micro-mirrors. For display applications, the micro-mirrors are generally fabricated using semiconductor processing techniques to provide devices with dimensions on the order of 15 μm×15 μm or smaller. Using such small mirrors enables display applications to use SLMs in applications characterized by increased image resolution for a given display size. Merely by way of example, HDTV systems, with a resolution of 1,080 scan lines×1,920 pixels/line, are currently available to consumers.

In some applications, the memory array associated with an electrode is fabricated using DRAM memory cells. DRAM cells provide benefits in some SLM applications including device sizes appropriate to the micro-mirror pixel size discussed above. However, DRAM cells leak charge during operation, resulting in the need to recharge the DRAM cells to the appropriate electrode voltage on a periodic basis. Other applications utilize SRAM memory cells as electrode drivers, such as a six transistor SRAM memory element.

FIG. 1 is a simplified schematic illustration of a conventional six transistor (6T) SRAM memory element. As illustrated in FIG. 1, the gates of PMOS transistor 114 and NMOS transistor 116 are coupled and are connected to node 120. The gates of PMOS transistor 110 and NMOS transistor 112 are coupled and are connected to node 122. In general, node 120 is connected to a first terminal and node 120 is connected to a second terminal and the voltages are the two terminals are complementary. Node 120 is connected to an electrode E in FIG. 1 and node 122 is connected to an electrode with an opposite polarity ($\bar{E}$).

The bit line with signal B is connected to the drain/source of NMOS transistor 132 and the bit-bar line with signal $\bar{B}$ is connected to the drain/source of NMOS transistor 134. The gates of transistors 132 and 134 are connected to the wordline (WL). As will be evident to one of skill in the art, prior to writing operations, the bit line B and the bit-bar $\bar{B}$ lines are precharged high. To write a "1" value to node 120, the bit-bar $\bar{B}$ line is pulled to ground (low). Alternatively, to write a "0" value to node 129, the bit line B is pulled to ground. Thus, writing in the conventional six transistor SRAM illustrated in FIG. 1 is performed by precharging both the bit line and the bit-bar line to high and then pulling a selected line (B or $\bar{B}$) to ground.

In the memory element illustrated in FIG. 1, the transistor strength, which depends on the transistor size, is selected so that during write operations, a "0" on the bit line will overpower transistor 110 or 114 during write. Thus, the word line transistor 132/134 is at least 1.5 times the size of PMOS transistors 110/114. At the same time, the NMOS transistors 112/116 must be able to pull the bit line down during read operations, placing the constraint on NMOS transistors 112/116 to be 1.5 to 2 times the size of the word line transistors 132/134. Thus, the transistor sizing for the conventional cell for proper read and write operations is: $M_{110,114} < M_{132,134} < M_{112,116}$. In the cell illustrated in FIG. 1, the sizing is $\{M_{110,114}=1\times\} < \{M_{132,134}=1.5\times\} < \{M_{112,116}=3\times\}$.

One option for increasing the number of micro-mirrors in an array is to add additional micro-mirrors to the array. However, additional micro-mirrors of a conventional size increase the silicon real estate used to fabricate the array. Another option is to add additional micro-mirrors while decreasing the size of the individual micro-mirrors, thereby maintaining a generally constant array dimension size. As the size of the micro-mirrors is decreased, the dimensions of the memory cells and electrodes associated with each mirror are generally decreased. Using conventional 6T SRAM designs, the size limitations on the transistor size ratios drives the footprint requirement, resulting in limitations on the ability of a designer to reduce the size of the SRAM cells to support the fabrication of smaller micro-mirrors in high resolution display applications. Thus, there is a need in the art for a spatial light modulator with an improved memory cell architecture.

SUMMARY OF THE INVENTION

According to the present invention, techniques related to spatial light modulators are provided. More particularly, the invention relates to a method and apparatus for providing control circuitry for actuation of mirrors in a spatial light modulator. Merely by way of example, the invention has been applied to a design of addressing circuitry suitable for driving electrodes associated with micro-mirrors in a spatial light modulator used in a display application. The method and apparatus can be applied to spatial light modulators as well as other devices, for example, micro-electromechanical sensors, detectors, and displays.

In an embodiment of the present invention, a memory cell for driving a complementary pair of electrodes associated with a micro-mirror of a spatial light modulator is provided. The memory cell includes two PMOS transistors coupled to a voltage source providing a source voltage. The two PMOS transistors are characterized by a first size. The memory cell also includes two NMOS transistors coupled to ground. Each of the two NMOS transistors are coupled to one of the two PMOS transistors and are characterized by a second size substantially equal to the first size. The memory cell further includes two word line transistors coupled to a word line and characterized by a third size substantially equal to the first size.

In another embodiment of the present invention, a memory cell for driving a complementary pair of electrodes associated with a micro-mirror of a spatial light modulator is provided. The memory cell includes a latch loop configured to retain either a first voltage associated with a logic level "1" or a second voltage associated with a logic level "0". The latch loop includes a pair of access transistors. A first terminal of each of the pair of access transistors is coupled to the latch loop and a gate of each of the pair of access transistors is coupled to a word line. The memory cell also includes a word line driver coupled to the word line and a voltage multiplexer coupled to the word line driver and configured to provide at least a read voltage and a write voltage to the word line.

In a specific embodiment of the present invention, a memory cell is provided. The memory cell includes a latch loop configured to retain a plurality of logic states. The latch loop includes a pair of cross-coupled inverters. The memory cell also includes a pair of access transistors. A first terminal of each of the pair of access transistors is coupled to the latch loop and a gate of each of the pair of access transistors is coupled to a word line. The pair of access transistors are characterized by a first gain associated with a reading of the plurality of logic states and a second gain associated with a writing of the plurality of logic states. The memory cell further includes a word line driver coupled to the word line.

In another specific embodiment of the present invention, a memory cell is provided. The memory cell includes a pair of cross-coupled inverters. Each of the pair of cross-coupled inverters is coupled to a first voltage source providing a high voltage and to a second voltage source providing a low voltage. Also, each of the pair of cross-coupled inverters has a PMOS transistor and an NMOS transistor. A size of the NMOS transistor is less than or equal to twice a size of the PMOS transistor. The memory cell also includes a pair of word line transistors. Each of the pair of word line transistors is coupled between one of the pair of cross-coupled inverters and a word line. A size of each of the pair of word line transistors is less than 150% of the size of the PMOS transistor. The memory cell also includes a multiplexer coupled to the word line and selectable to alternately provide a write voltage or a read voltage to the word line. The write voltage is greater than or equal to ¾ of the high voltage and the read voltage is less than half the high voltage.

In an alternative embodiment of the present invention, a method of reading a value stored in a memory cell coupled to a power supply characterized by a high voltage is provided. The method includes providing a read voltage less than or approximately equal to half of the high voltage and selecting the read voltage. The method also includes turning off a precharge circuit coupled to the memory cell through a bit line and applying the read voltage to a word line of the memory cell. The method further includes enabling a differential sense amplifier coupled to the memory cell through the bit line and sensing a voltage on the bit line.

Numerous benefits are achieved using the present invention over conventional techniques. For example, an embodiment according to the present invention provides a reduction in the size of the electrode driver in comparison to conventional devices. For instance, embodiments of the present invention using six minimum design rule transistors may result in electrode drivers using approximately 30% less real estate than conventional six transistor SRAM cells. Additionally, embodiments provide electrode drivers consuming less power than in some conventional designs. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

According to the present invention, techniques related to spatial light modulators are provided. More particularly, the invention relates to a method and apparatus for providing control circuitry for actuation of mirrors in a spatial light modulator. Merely by way of example, the invention has been applied to a design of addressing circuitry suitable for driving electrodes associated with micro-mirrors in a spatial light modulator used in a display application. The method and apparatus can be applied to spatial light modulators as well as other devices, for example, micro-electromechanical sensors, detectors, and displays.

Figure 2:
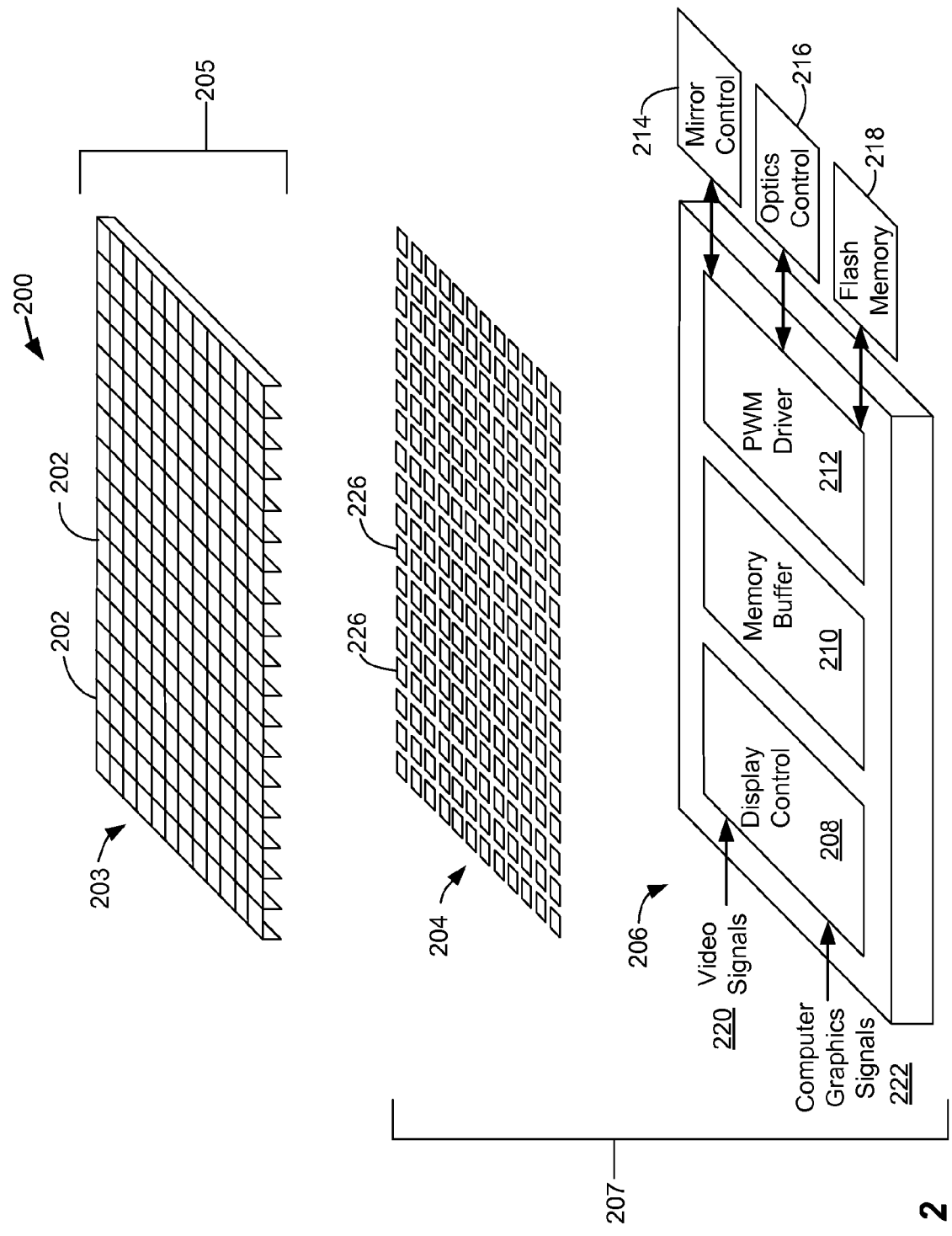
FIG. 2 is a simplified perspective view of an SLM according to an embodiment of the present invention.

FIG. 2 is a diagram that illustrates the general architecture of a spatial light modulator (SLM) 200. The illustrated embodiment has three layers. The first layer is a mirror array 203 that has a plurality of deflectable micro-mirrors 202. In a preferred embodiment, the micro-mirror array 203 is fabricated from a first substrate 205 that is a single material, such as single crystal silicon. Additional details related to SLMs using such an architecture are described in commonly assigned U.S. Pat. No. 7,118,234, issued on Oct. 10, 2006, and hereby incorporated by reference for all purposes.

The second layer is an electrode array 204 with a plurality of electrodes 226 for controlling the micro-mirrors 202. Each electrode 226 is associated with a micro-mirror 202 and controls the deflection of that micro-mirror 202. Addressing circuitry allows selection of a single electrode 226 for control of the particular micro-mirror 202 associated with that electrode 226.

The third layer is a layer of control circuitry 206. This control circuitry 206 has addressing circuitry, which allows the control circuitry 206 to control a voltage applied to selected electrodes 226. This allows the control circuitry 206 to control the deflections of the mirrors 202 in the mirror array 203 via the electrodes 226. Typically, the control circuitry 206 also includes a display control 208, line memory buffers 210, a pulse width modulation array 212, and inputs for video signals 220 and graphics signals 222. A microcontroller 214, optics control circuitry 216, and a flash memory 218 may be external components connected to the control circuitry 206, or may be included in the control circuitry 206 in some embodiments. In various embodiments, some of the above listed parts of the control circuitry 206 may be absent, may be on a separate substrate and connected to the control circuitry 206, or other additional components may be present as part of the control circuitry 206 or connected to the control circuitry 206.

In an embodiment according to the present invention, both the second layer 204 and the third layer 206 are fabricated using semiconductor fabrication technology on a single second substrate 207. That is, the second layer 204 is not necessarily separate and above the third layer 206. Rather, the term "layer" is an aid for conceptualizing different parts of the spatial light modulator 200. For example, in one embodiment, both the second layer 204 of electrodes is fabricated on top of the third layer of control circuitry 206, both fabricated on a single second substrate 207. That is, the electrodes 226, as well as the display control 208, line memory buffers 210, and the pulse width modulation array 212 are all fabricated on a single substrate in one embodiment. Integration of several functional components of the control circuitry 206 on the same substrate provides an advantage of improved data transfer rate over conventional spatial light modulators, which have the display control 208, line memory buffers 210, and the pulse width modulation array 212 fabricated on a separate substrate. Further, fabricating the second layer of the electrode array 204 and the third layer of the control circuitry 206 on a single substrate 207 provides the advantage of simple and cheap fabrication, and a compact final product. After the layers 203, 204, and 206 are fabricated, they are bonded together to form the SLM 200. Additional examples of methods for joining the substrates to form a bonded substrate structure are described in commonly assigned U.S. Pat. No. 7,022,245, issued on Apr. 4, 2006, and hereby incorporated by reference for all purposes.

As illustrated in FIG. 2, the substrate 205 includes a number of standoff regions extending from a lower portion of the substrate and arranged in an array as a waffle pack grid pattern. The standoff regions are adapted to align with bonding areas located between adjacent electrodes 226. Mirrors 202 are formed in the upper layers of substrate 205 by a release process in later stages of processing. In some designs, the standoff regions provide mechanical support for the mirror structure and are not moveable. Thus, light reflected from the upper surfaces of the standoff structures reduces the contrast of the optical system incorporating the spatial light modulator. In some designs, an absorbent material may be applied to the upper surfaces of the standoff regions to reduce reflections. However, these approaches reduce the fill factor of the array, potentially degrading system performance.

Figure 3:
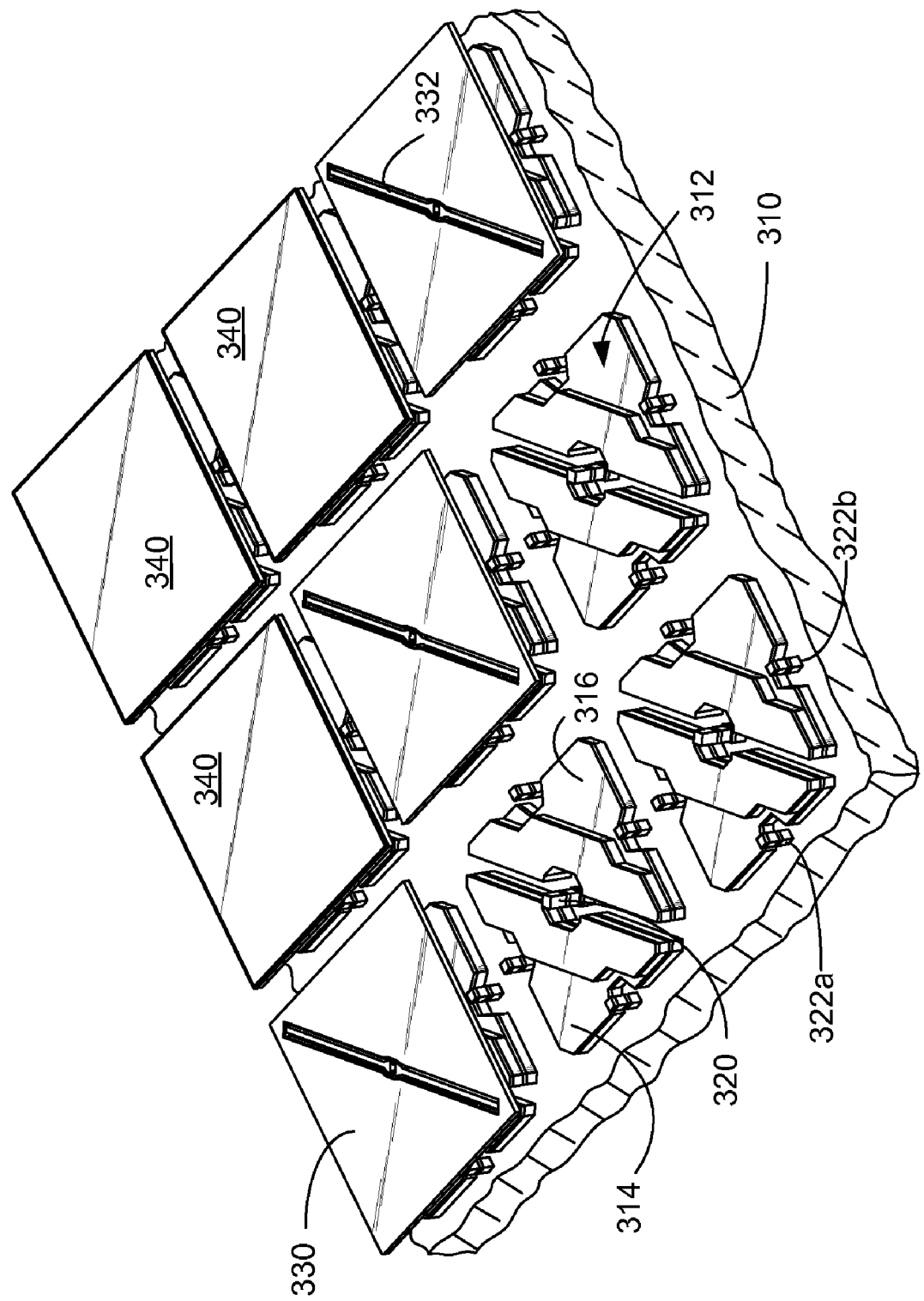
FIG. 3 is a simplified cutaway perspective view of an array of SLMs according to another embodiment of the present invention.

FIG. 3 is a simplified cutaway perspective views of an array of SLMs according to another embodiment of the present invention. As illustrated, this cutaway view is merely representative of the array of SLMs at various stages of processing. As described more fully below, independent control of the SLMs in an array is utilized in embodiments according to the present invention to form images in display applications and other apparatus.

As illustrated in FIG. 3, the array of SLMs is mounted on a support substrate 310. In some embodiments, the support substrate is a silicon substrate with CMOS control circuitry fabricated using semiconductor processing techniques. Multi-level electrodes 312 are coupled to the support substrate 310. As illustrated in FIG. 3, the multi-level electrodes comprise two complementary electrodes 314 (referred to as electrode E) and 316 (referred to as electrode E) positioned on opposite sides of an integrated standoff structure 320. As described more fully below, drive voltages of opposite polarity are provided to the complementary electrodes, providing both electrostatic attraction and repulsion forces to the micro-mirror plates 330.

FIG. 3 illustrates an embodiment of the present invention in which the complementary electrodes are multi-level electrodes with raised central portions adjacent the center of the micro-mirror plates. Such multi-level electrodes reduce the distance between the top of the electrode surface and the micro-mirror plates, thereby decreasing the magnitude of the addressing voltages used to actuate the micro-mirror plates. However, embodiments of the present invention are not limited to multi-level electrodes. In alternative embodiments, other electrode geometries are utilized. One of ordinary skill in the art would recognize many variations, modifications, and alternatives.

As illustrated in FIG. 3, each micro-mirror plate 330 is coupled to the support substrate 310 by integrated standoff structure 320 and a torsion spring hinge 332. Referring to one of the micro-mirrors 340, upon actuation of the electrodes, the micro-mirror plate rotates in a plane orthogonal to the longitudinal axis of the torsion spring hinge. In some embodiments, the longitudinal axis of the torsion spring hinge is parallel to a diagonal of the micro-mirror plate. The motion of the micro-mirror is arrested by landing structures 322. In order to provide two actuated positions, complementary sets of landing structures 322a and 322b are provided on opposite sides of the integrated standoff structure. Thus, landing structures 322a arrest the motion of the micro-mirrors at a first actuated position and landing structures 322b arrest the motion of the micro-mirrors at a second actuated position. According to embodiments of the present invention, the micro-mirrors are tilted at predetermined angles in the actuated states, providing for controlled reflection of incident radiation.

The support substrate 310, the integrated standoff structures 320, and the micro-mirror plates 330 are joined using a substrate bonding process according to some embodiments of the present invention. In other embodiments, these structures are fabricated using a combination of deposition, patterning, etching, wafer bonding, and other semiconductor processing techniques. As illustrated in FIG. 3, reflective surfaces 340 are formed on the micro-mirror plates, providing an array of SLMs with hidden hinges. For purposes of clarity, the spacing between adjacent micro-mirrors is illustrated in FIG. 3 as a significant fraction of the mirror dimensions. As will be evident to one of skill in the art, reductions in the space between mirrors will result in an increased fill ratio and improved image quality in display applications. The spacing between adjacent micro-mirrors is generally defined using photolithographic processes, providing high fill ratio designs. Additional details related to the fabrication of integrated standoff structures and multi-level electrodes are described in commonly owned U.S. patent application Ser. No. 11/250,320, filed Oct. 13, 2005, and hereby incorporated by reference for all purposes.

Although FIGS. 2 and 3 represent an example of a particular SLM suitable for use with the memory cell described herein, and portions thereof, embodiments of the present invention are not limited to use with the particular SLM illustrated in FIGS. 2 and 3. Other SLM designs, including the structures described in U.S. patent application Ser. No. 11/448,149, filed on Jun. 5, 2006, entitled "High Fill Ratio Silicon Spatial Light Modulator," commonly assigned and hereby incorporated by reference in its entirety for all purposes, are suitable for use with embodiments of the present invention. Thus, additional SLM designs are suitable for use with the memory cells described herein and are included within the scope of embodiments of the present invention.

Figure 4:
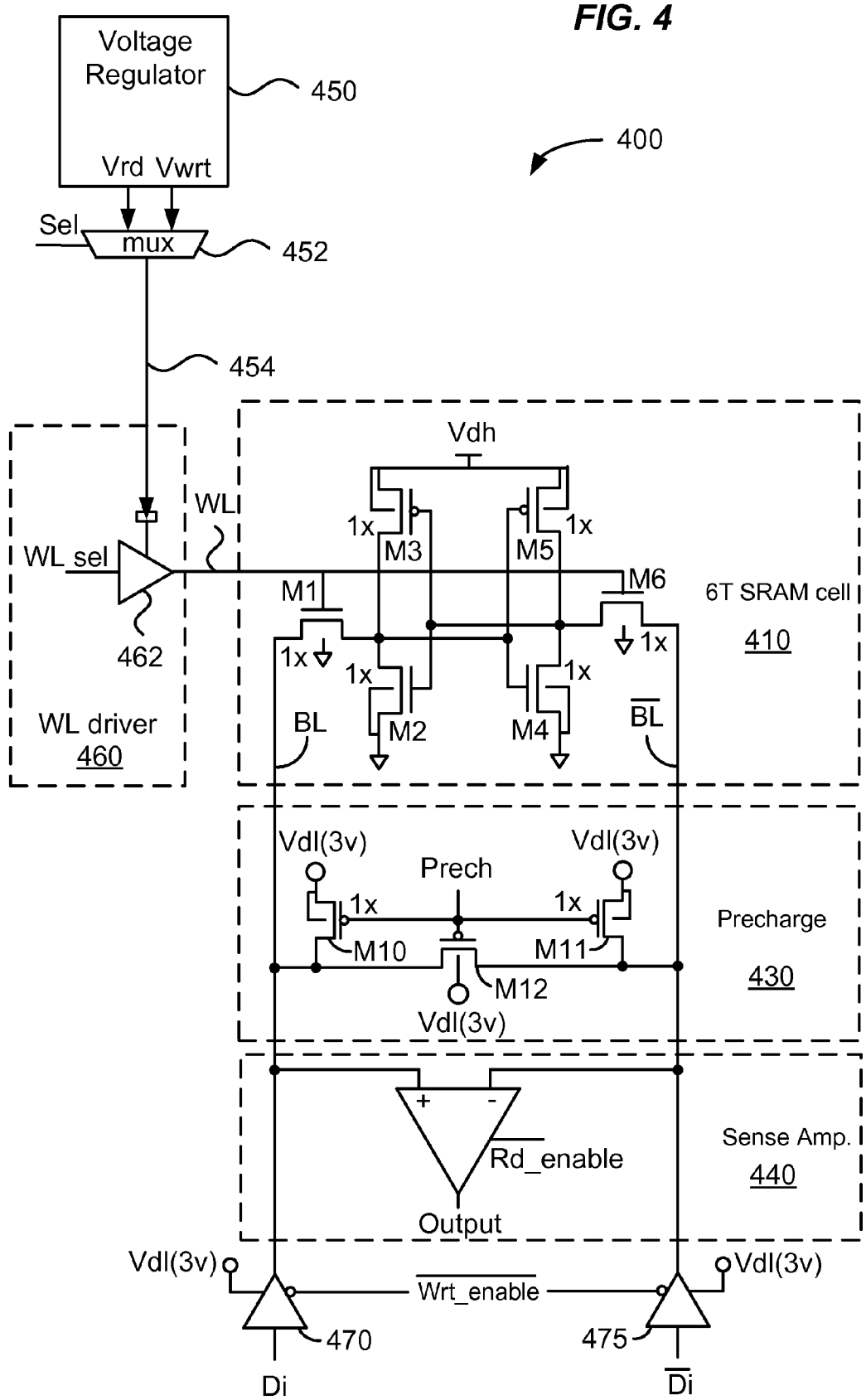
FIG. 4 is a simplified schematic illustration of an electrode driver for an SLM according to an embodiment of the present invention.

FIG. 4 is a simplified schematic illustration of an electrode driver 400 for an SLM according to an exemplary embodiment of the present invention. Referring to FIG. 4, a 6T SRAM cell 410, is coupled to a word line WL and between bit line BL and bit line-bar $\overline{BL}$. The 6T SRAM cell 410 is a six transistor SRAM memory cell. PMOS transistor M3 and NMOS transistor M2 are coupled in series between a high-level Vdd (Vdh) and ground, forming a first inverter. PMOS transistor M5 and NMOS transistor M4 are coupled in series between Vdh and ground, forming a second inverter. The first inverter and the second inverter are crossed-coupled to form a latch loop. NMOS transistors M1,M6 provide access to the latch loop from bit line BL and bit line-bar $\overline{BL}$. Transistors M1 and M6, which are referred to herein as word line transistors, may also be referred to as read/write pass gate, access devices or transistors, or the like. Thus, although transistors M1, M6 are referred to as word line transistors because of their connection to the work line, such reference is not intended to limit the scope of embodiments of the present invention.

PMOS transistors M3, M5 and NMOS transistors M1, M6, M2, M4 are all dimensionally "1×" devices. The "1×" designation is a sizing factor relating the width and length of a transistor's gate. For a given generation of CMOS semiconductor fabrication, a base-cell or reference-cell may be defined, which establishes the width and length of reference transistor gate dimensions for both a PMOS and an NMOS device. The base-cell reference NMOS and PMOS transistors are designed with minimal dimensions for the given generation of process technology. The base-cell reference provides minimal transistor dimensions that may be practically implemented across variations in process and temperature for the given generation of semiconductor fabrication. The sizing factor is also a measure of the relative strength between two devices of the same conductivity type. For example, if a first NMOS transistor is a 1× device and a second NMOS transistor is a 2× device, the second device is twice as strong in current conduction capability as the first transistor.

Figure 1:
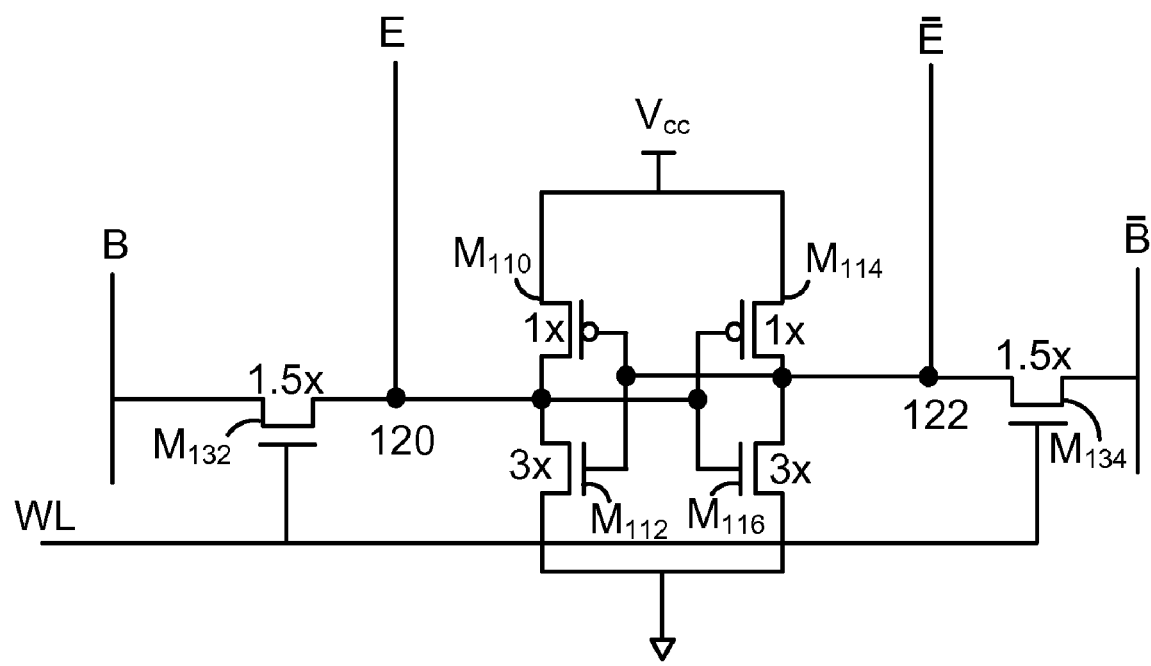
FIG. 1 is a simplified schematic illustration of a conventional six transistor SRAM memory element.

In the conventional 6T SRAM memory element illustrated in FIG. 1, transistor sizing is $\{M_{110,114}=1\times\}<\{M_{132,134}=1.5\times\}<\{M_{112,116}=3\times\}$, where each "× sizing factor" represents a multiple of the drive strength of a corresponding conductivity type base-cell reference transistor. In contrast with conventional 6T SRAM cells, the corresponding transistor sizing for the 6T SRAM cell 410 illustrated in FIG. 4 is M3, M5, M1, M6, M2, M4=1×. The relative drive strength of all six transistors (within each corresponding conductivity type) is the same. In other embodiments, the relative drive strengths of the six transistors are within a predetermined percentage of each other, for example, within 50%, 40%, 30%, 20%, 10%, 5% or the like.

With the transistor sizing for all six transistors being 1×, and therefore equal to the respective minimal dimensions of the corresponding reference transistors, a minimal SRAM memory cell size is accomplished. By so configuring the SRAM memory cell, a minimal micro-mirror footprint may be realized. As described herein, transistors with substantially the same size includes transistors designed to be the same size and varying in size due to process tolerances. Additionally, transistors substantially the same size includes transistors that are designed to be different sizes, but smaller than in conventional designs. In some embodiments, the sizes of M1, M2, M3, M4, M5, M6 are within 50% of each other, within 40% of each other, within 30% of each other, within 20% of each other, within 10% of each other, within 5% of each other, or the like. One of ordinary skill in the art would recognize many variations, modifications, and alternatives.

The electrode driver 400 further includes a Precharge circuit 430 coupled between bit line BL and bit line-bar $\overline{BL}$, in the present exemplary embodiment. The Precharge circuit 430 is used to establish an equal and predetermined voltage on each of bit line BL and bit line-bar $\overline{BL}$ prior to a read or a write operation. Precharge transistors M10, M11 are coupled between a low-level Vdd (Vdl) and bit line BL and bit line-bar $\overline{BL}$, respectively. Vdl may be set, for example, at 3 volts (V). Precharge transistor M12 couples between bit line BL and bit line-bar $\overline{BL}$. All precharge transistors M10, M11, M12 have a gate terminal coupled to a precharge node Prech. With application of a low-level voltage on precharge node Prech, all three precharge transistors M10, M11, M12 are activated and provide the voltage level on Vdl (e.g., 3 V) to bit line BL and bit line-bar $\overline{BL}$. Because the read voltage Vrd is kept low, this allows Vdl to be provided at a low voltage, so that the read voltage does not flip the cell during read operations, thereby saving power compared to conventional SRAM designs.

A Sense Amplifier 440 is coupled between bit line BL and bit line-bar $\overline{BL}$ in the electrode driver 400. The Sense Amplifier 440 has a positive input terminal coupled to bit line BL and a negative input terminal coupled to bit line-bar $\overline{BL}$. Sense Amplifier 440 may be enabled with a positive assertion signal on a read enable terminal Rd_enable. The Sense Amplifier 440 output signaling is produced on an output terminal Output.

Bit line BL and bit line-bar $\overline{BL}$ each have a corresponding bit line driver 470, 475 connected to data inputs Di and $\overline{Di}$ respectively in the present exemplary embodiment. The bit line drivers 470, 475 are activated with a write enable-bar signal $\overline{Wrt\_enable}$ (active-low level). Each of the bit line drivers 470, 475 is supplied with an output drive voltage provided by Vdl, which may be, for example, 3 V.

The transistor drive strength is a function of the gate voltage. Thus, embodiments of the present invention modify the transistor drive strength for the word line transistors M1 and M6 by varying the word line voltage as described more fully throughout the present specification. Because the transistor strength is modified by operating voltages, embodiments of the present invention provide 6T cells in which all the transistors M1 through M6 are minimum design rule transistors.

In order to write a "0" or a "1" to the memory cell, the multiplexer 452, connected to the voltage regulator 450, is operated (Sel) to select the write voltage Vwrt, which is applied to node 454. The word line select amplifier 462 of the word line driver 460 is selected (WL_sel) and the voltage Vwrt is applied to the word line WL. The voltage used to write to the cell (Vwrt) is sufficient to make M1 and M6 strong enough to over drive PMOS transistors M3 and M5. As an example, in a specific embodiment, the write voltage is about 12 V, although this is not required by the present invention. In other embodiments, the write voltage ranges from about ¾Vdh≦Vwrt≦Vdh, where Vdh=18V. In other applications, the value used for the write voltage varies depending on the particular application. Thus, although Vdh=18V is utilized in some display applications, where high voltages are applied to the electrodes of the display elements, other applications will utilize lower voltages to power the 6T SRAM cell 410. One of ordinary skill in the art would recognize many variations, modifications, and alternatives.

In order to write a "1" to the memory cell, a high-level voltage is produced by bit line driver 470 on bit line BL and a low-level voltage is produced by bit line driver 475 on bit line-bar $\overline{BL}$. Taking the perspective from bit line-bar $\overline{BL}$, the low-level voltage on bit line-bar $\overline{BL}$ is used to overpower PMOS transistor M5 (in the second inverter) and pull the input voltage level of the first inverter (transistors M3, M2) below the inverter's logic threshold voltage Vinv. The logic threshold voltage Vinv may be alternately referred to as "the logic inversion threshold" and either term refers to that point on an inverter transfer characteristic where Vin=Vout. By producing a voltage level below the logic threshold voltage Vinv at the input terminal of the first inverter (transistors M3, M2), the first inverter (M3, M2) produces a high-level output voltage which satisfies the condition for writing a "1" to the memory cell.

To produce a voltage level below the logic threshold voltage Vinv at the input terminal of the first inverter, transistor M6 must have a stronger drive strength than transistor M5. To verify that this drive strength comparison is met, the two transistors are viewed with regard to their respective saturation currents. At the conditions where transistor M6 is driven by a gate voltage equal to Vwrt and transistor M5 is being driven with a gate voltage equal to 0 V, we can evaluate whether the saturation currents of M6 is greater than the saturation current of M5. We consider both devices being in saturation (which is approximately the case at the logic threshold voltage Vinv) and expect that the transistor with greater saturation current will dominate over the other transistor.

For an MOS transistor, the saturation current is given as $$Ids = \frac{\mu \varepsilon W}{2DL}(Vgs - Vth)^2,$$

where $\mu$ is $\mu_n$ or $\mu_p$ for the mobility of electrons or holes (for NMOS or PMOS transistors) respectively, $\varepsilon$ is the permittivity of the gate oxide, D is the gate oxide thickness, W is the gate width, L is the gate length, Vgs is the gate voltage, and Vth is the respective transistor type (n-type or p-type) threshold voltage. We want to confirm the condition for Ids (M6)>Ids(M5) to assure that a "1" may be written to the memory cell.

Being fabricated within the same semiconductor technology, the factors $$\frac{\varepsilon}{D}$$

are the same for each device and therefore cancel-out from consideration. Since all transistors have a sizing factor of approximately 1×, the factors $$\frac{W}{L}$$

cancel-out from consideration as well. Since Vgs(M6)=Vwrt and Vgs(M5)=0 V, and for device threshold voltages (Vth) being about equal for each transistor type, the determination of the inequality $\mu_n \cdot Vwrt^2 > \mu_p \cdot Vdh^2$ determines the condition for Vwrt to drive transistor M6 sufficiently to overpower (out-drive) transistor M5. Solving for Vwrt, it is determined that it must be the case that $$Vwrt \geq \sqrt{\frac{\mu_p}{\mu_n}} \cdot Vdh = \sqrt{\frac{.5}{1.3}} \cdot Vdh = 0.62\ Vdh$$

for Ids(M6)>Ids(M5). When the write voltage ranges, as given above in the present exemplary embodiment, from about $$\frac{3}{4}$$

Vdh≦Vwrt≦Vdh, the conditions for transistor M6 to have a stronger drive strength than transistor M5 are met. This also shows that the sizing factors of all devices being 1× works in conjunction with the principle of a transistor's drive strength being a function of the gate voltage, and results in allowing a word line transistor, such as M6, to write a "1" into the memory cell.

From symmetry in the 6T SRAM cell 410, a "0" may be written to the memory cell by a high-level voltage being produced by bit line driver 475 on bit line-bar $\overline{BL}$ and at the same time a low-level voltage being produced by bit line driver 470 on bit line BL. The process and interaction as described above for writing a "1" holds in a complementary fashion for the writing of a "0."

In order to read the value stored in the memory cell, the multiplexer 452 connected to the voltage regulator 450 is operated (SEL) to select the read voltage Vrd, which is applied to node 454. The word line select amplifier 462 of the word line driver 460 is selected and the voltage Vrd is applied to the word line WL. The voltage used to read the value stored in the cell (Vrd) is low enough to make M1 and M6 weaker than NMOS transistors M2 and M4. As an example, in a specific embodiment, the read voltage is about 7 V, although this is not required by the present invention. In other embodiments, the read voltage is about $$Vrd \leq \frac{1}{2}Vdh,$$

where Vdh=18V. In other applications, the value used for the read voltage varies depending on the particular application. One of ordinary skill in the art would recognize many variations, modifications, and alternatives.

During read operations for the 6T SRAM cell 410 illustrated in FIG. 4, since all the transistors M1-M6 are approximately the same size, the small size and strength of M2 and M4 can result in the bit line voltage flipping the cell. Thus, the read voltage applied to the gates of M1 and M6 is provided at a low enough level to make M1 and M6 weaker than M2 and M4, thereby preventing flipping of the cell during read operations.

In order to read a "1" from the memory cell, read voltage Vrd is produced on the word line WL while the precharge voltage resides on bit line-bar $\overline{BL}$ (subsequent to a pre-charge cycle) and a low-level voltage is being driven by transistor M4 at the node in common with transistor M5. From the perspective of bit line-bar $\overline{BL}$, the precharge voltage on bit line-bar $\overline{BL}$ must not flip the memory cell (cause the memory cell to acquire the complementary state) during the read operation.

This is the case when transistor M4 is strong enough to maintain a voltage on its drain terminal below the logic threshold voltage Vinv of the first inverter (M3,M2). The low-level voltage produced by transistor M4 at its drain terminal must be able to overcome the precharge voltage and provide the low-level voltage to the negative input of the Sense Amplifier 440. A complementary situation occurs at the complementary memory cell node with transistor M2 relative to transistor M1 and bit line BL when a "0" is being read as a low-level voltage to the positive input of the Sense Amplifier 440. By symmetry, the explanation provided herein for reading a "1" applies to the complementary devices and terminals for reading a "0."

In order for the memory cell to not be flipped by the precharge voltage on bit line-bar $\overline{BL}$ during the reading of a "1," two factors are taken into account. One factor is the drive strength of transistor M6 compared to transistor M4 and a second factor is the precharge voltage level on bit line-bar $\overline{BL}$ prior to the read operation. In the case of drive strength, the effective drive strength of transistor M6, when the read voltage Vrd is applied to the gate of transistor M6, must be less than the effective drive strength of transistor M4. This is the condition for transistor M4 to maintain a voltage level at its drain terminal less than the logic threshold voltage Vinv of the first inverter (transistors M3, M2) when transistor M6 is activated by the read voltage Vrd and couples to the voltage on bit line-bar $\overline{BL}$. Transistor M4 is driving a low-level voltage at its drain terminal in order to retain a "1" state and has a gate voltage of Vdh.

The logic threshold voltage Vinv of the first inverter is the condition for which Idsn=−Idsp for an n-type and a p-type MOS transistor (transistors M2 and M3 respectively) configured as an inverter. For the illustrated embodiment, with 1× sizing factor, NMOS and PMOS transistors, and from the common practices of $$\text{``}\frac{\beta_n}{\beta_p}$$

"ratioing," the logic threshold voltage Vinv will be about $$\frac{\mu_p}{\mu_n}$$

Vdh or $$\frac{.5}{1.3}$$

18V≈7V. When transistor M6 is first turned on, the drain-source voltage (Vds) is the precharge voltage minus the output voltage of transistor M4 (0 V). The precharge voltage is, for example, Vdl=3 V, which is significantly less than the logic threshold voltage Vinv (see below). Transistors M6 and M4 are each NMOS transistors with the same mobility, gate oxide thickness, and gate dimensions. The only difference between M6 and M4 is the gate voltage applied during operation. Since transistors M6 and M4 are identical in all aspects except their gate voltages, and the relative drive strength of each transistor is controlled by the gate voltage (discussed above), the gate voltage difference between the two transistors is the determinant of the relative drive strength of the two devices. If Vgs(M6)=Vgs(M4) then the transistors would each drop about half the voltage coming from bit line-bar $\overline{BL}$.

From the saturation current expression $$\left(Ids = \frac{\mu\varepsilon W}{2DL}(Vgs - Vth)^2\right),$$

for both transistors M6 and M4. For the drive strength inequality, Ids(M6)<Ids(M4). Therefore, Vgs(M6)<Vgs(M4)=18 V. A value Vgs(M6) is selected to be less than Vgs(M4) (without placing a constraint on the voltage on bit line-bar $\overline{BL}$). This leaves only consideration of the voltage level applied to transistor M6 by bit line-bar $\overline{BL}$ after precharge versus any likelihood of flipping the memory cell.

In the present exemplary embodiment, the voltage level at risk of causing a flipping of the memory cell is the precharge voltage on bit line BL and bit line-bar $\overline{BL}$. Consider the situation where the 6T SRAM cell 410 stores a "1." Two cases are considered to determine the resilience of the 6T SRAM cell 410 against being unintentionally flipped (i.e., changing the data value stored in the cell). First, the precharge voltage on bit line-bar $\overline{BL}$ is not enough to raise the voltage applied to the node in common with the input of the first inverter (M3, M2) and the output of the second inverter (M5,M4) above the inversion threshold of the first inverter (by overpowering the pull-down strength of transistor M4). A second consideration is that the precharge voltage on bit line BL in combination with the drive strength of transistor M1 is not sufficient to overpower the pull-up strength of transistor M3 and subsequently pull the input voltage to the second inverter (M5,M4) below its logic threshold voltage Vinv.

In the first situation, with the precharge voltage being Vdl=3 V, the greatest voltage applied to the drain terminal of transistor M6 from bit line-bar $\overline{BL}$ is significantly less than a logic threshold voltage Vinv (about 7 V) of the first inverter (M3,M2). Generally, any value of Vrd which does not allow the precharge bit line voltage applied at M6 to exceed the logic threshold voltage Vinv (plus some design margin) is sufficient to ensure that the memory cell is not flipped during a read operation. In the present exemplary embodiment, the precharge voltage level on bit line-bar $\overline{BL}$ (3 V) is at a level significantly less than the logic threshold voltage Vinv (about 7 V), so no significant risk of flipping a memory cell exists. Any precharge voltage on bit line-bar $\overline{BL}$ less than the logic threshold voltage Vinv will ensure that the 6T SRAM cell 410 is resilient against flipping by bit line-bar $\overline{BL}$. This leaves selection of the level of Vrd to be high enough to ensure that the drive strength of transistor M6 is sufficiently great to provide a rapid read operation. The condition, as given above, of the read voltage being about $$Vrd \leq \frac{1}{2} Vdh$$

satisfies the condition of not flipping the memory cell. By symmetry in the memory cell and by symmetry between the bit lines and their precharge voltage level, the same argument as above applies for the memory cell retaining a "0" during a read operation and the memory cell being resilient against being flipped.

In the second situation, with the precharge voltage of Vdl coming from bit line BL, the initial voltage in the present exemplary embodiment applied to the source terminal of transistor M1 in a read operation is Vdl=3 V. Resilience against the precharge voltage on the bit line BL flipping the 6T SRAM cell 410 is assured if the drive strength of transistor M1 with the precharge voltage applied to the source terminal and Vrd applied to the gate terminal is less than the drive strength of transistor M3 [i.e., when Ids(M1)<Ids(M3)]. In a fashion similar to that above in the memory cell writing situation, an inequality based on the saturation currents of transistors M1 and M3 is derived.

Since Vgs(M1)=Vrd and Vgs(M3)=0 V, and for device threshold voltages (Vth) being about equal for each transistor type, the inequality $\mu_n \cdot Vrd^2 < \mu_p \cdot Vdh^2$ determines the condition for Vrd to not drive transistor M1 sufficiently to overpower (out-drive) transistor M3. Solving for Vrd, it is determined that it must be the case that $$Vrd < \sqrt{\frac{\mu_p}{\mu_n}} \cdot Vdh = \sqrt{\frac{.5}{1.3}} \cdot Vdh = 0.62 \, Vdh$$

in order for Ids(M1)<Ids(M3). When the read voltage ranges, as given above in the present exemplary embodiment, $$Vrd < \frac{Vdh}{2},$$

the conditions for transistor M1 to have a weaker drive strength than transistor M3 are met. The 6T SRAM cell 410 is not flipped when, as specified above, the read voltage is less than half the high voltage. By symmetry in the memory cell and by symmetry between the bit lines and their precharge voltage level, the same argument as above applies for the memory cell retaining a "0" during a read operation and the memory cell being resilient against being flipped.

Referring to FIG. 4, the voltage applied to the precharge circuit 430 is lower than typically used in conventional memory cells. In the embodiment illustrated in FIG. 4, the power supply voltage Vdl is 3 V, which is significantly less than Vdh (18 V). As a result, significant power savings are achieved by embodiments of the present invention over conventional techniques. By reducing the word line read voltage, embodiments enable a reduction in Vdl (e.g., 3 V). Thus, power savings on the order of $$\left(\frac{Vdh}{Vdl}\right)^2 = \left(\frac{18}{3}\right)^2 = 36$$

are achieved by some embodiments of the present invention.

Table 1 illustrates exemplary voltages and settings for a memory cell operated according to a particular embodiment of the present invention in which Vdh=18V. In other embodiments, different voltages and settings will be used depending on the particular application. One of ordinary skill in the art would recognize many variations, modifications, and alternatives.

TABLE 1

| Operation | Word Line (WL) | Precharg (Prech) | Bit Line (BL) |
|---|---|---|---|
| Idle | ground | ground | Vdl |
| Write | Vwrt (12 V) | Vdl | Vdl/ground |
| Read | Vrd (7 V) | Vdl | Driven by 6T cell 410 |

Although the memory cell design illustrated in FIG. 4 has been described in relation to an application for a high voltage spatial light modulator useful in a projection display, embodiments of the present invention are not limited to these particular applications. Other applications that utilize 6T SRAM memory cells are included within the scope of the present invention. The inventors have noted that in applications with a low or high ratio of read to write applications, embodiments of the present invention are particularly suitable. In display applications, where reading of the cell is generally only performed during testing operations, the write:read ratio is high. In web server applications, which are typically reading data, the write:read ratio is low. Thus, in these high or low write: read ratio applications, slower read or write times resulting from differences in the read and write voltages compared to the supply voltage are more than compensated for by the reduced cell size provided by the embodiments described herein. One of ordinary skill in the art would recognize many variations, modifications, and alternatives.

Figure 5:
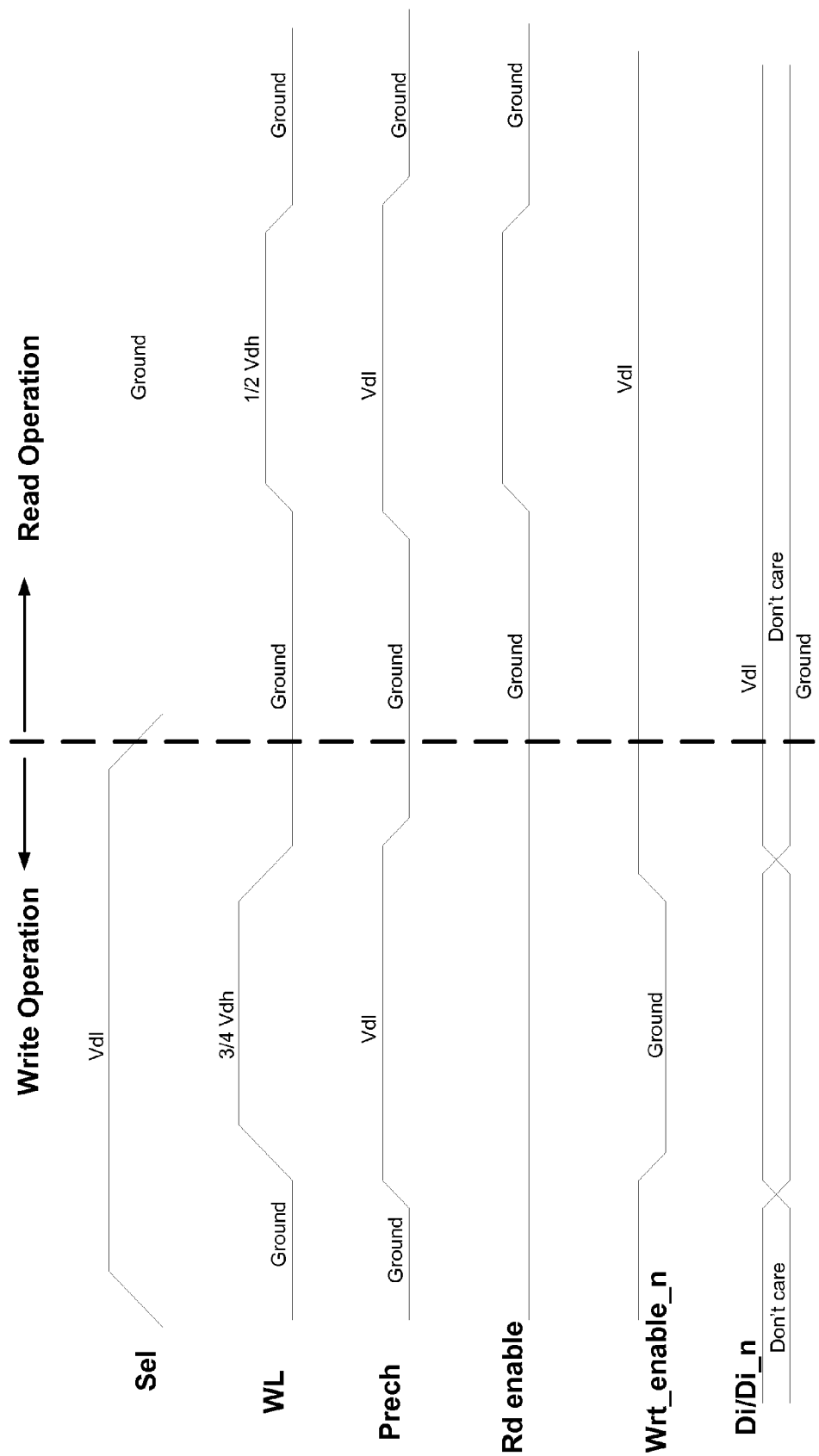
FIG. 5 is a simplified timing diagram illustrating operation of a memory cell according to an embodiment of the present invention.

FIG. 5 is a simplified timing diagram of the operation of a memory cell according to the present exemplary embodiment. For an extended amount of time prior to either a read or a write operation, bit line BL and bit line-bar $\overline{BL}$ are precharged to Vdl (3 V) by applying Ground to the precharge terminal Prech. The application of Ground to the gate terminals of transistors M10, M11, and M12 activates the PMOS transistors and pulls bit line BL and bit line-bar $\overline{BL}$ to Vdl. Within a read or a write operation, the Precharge circuit 430 is deactivated by applying a high-level voltage Vdl to the precharge terminal Prech. The high-level voltage Vdl on the gate terminals of transistors M10, M11, and M12 deactivates the transistors and isolates bit line BL and bit line-bar $\overline{BL}$ from Vdl. Bit line BL and bit line-bar $\overline{BL}$ are left floating at the precharge voltage (Vdl).

Initially, in a Write Operation, the voltage Vwrt is selected from the voltage regulator 450 by an active-high level, for example Vdl, on the select line Sel of the multiplexer 452. The voltage Vwrt, as explained above, is about equal to, for example, 0.75 Vdh and is applied during the Write Operation on node 454 as an effective word line source voltage to the word line select amplifier 462.

Next in the Write Operation, the Precharge circuit 430 is deactivated as explained above and data is applied to data_in Di and data_in-bar Di_n inputs of bit line drivers 470, 475 respectively. The write enable-bar signal $\overline{Wrt\_enable}$ is applied to the bit line drivers 470, 475 and the corresponding data levels are applied to bit line BL and bit line-bar $\overline{BL}$. As a word line select signal (not shown) is applied to the word line select terminal WL_sel, the word line select amplifier 462 is activated with the voltage Vwrt as the output drive level and brings the word line WL from Ground to, for example, 0.75 Vdh. The data levels on bit line BL and bit line-bar $\overline{BL}$ are applied to the memory cell at transistors M1 and M6 respectively. The write voltage Vwrt enables transistors M1 and M6 to overpower the activated one of either PMOS transistors M3 or M5. As explained above and through symmetry, the one of transistors M1 or M6 that is coupled to the bit line being driven low (by either one of bit line drivers 470, 475) is driven by Vwrt to be strong enough to overpower the PMOS transistor M3 or M5 (presumed active in sustaining a complementary state to the state being written to the memory cell). At the conclusion of the write operation the levels for the write enable-bar signal $\overline{\text{Wrt\_enable}}$ and the word line select signal are complemented and Ground is applied to the precharge terminal Prech.

In a Read Operation, the voltage Vrd is selected from the voltage regulator 450 by Ground being applied on the select line Sel of the multiplexer 452. The voltage Vrd, as explained above, is about equal to, for example, 0.5 Vdh and is applied during the Read Operation on node 454 as an effective word line source voltage to be applied to the word line select amplifier 462.

The Precharge circuit 430 is deactivated as explained above and the read voltage Vrd is applied to a word line WL by the word line select signal (not shown). A high-level logic voltage is applied on the read enable terminal Rd_enable of the Sense Amplifier 440. As a word line select signal (not shown) is applied to the word line select terminal WL_sel, the word line select amplifier 462 is activated with the voltage Vrd as the output drive level, which brings the word line WL from Ground to, for example, 0.5 Vdh. The read voltage Vrd enables transistors M1 and M6.

As explained above, the drive strengths of NMOS transistors M1 and M6 are controlled by $$\left(\text{e.g., } Vrd \leq \frac{1}{2} Vdh\right)$$

so as to not be strong enough to overpower corresponding NMOS transistors M2 and M4 and PMOS transistors M3 and M5 when coupled to the precharge voltage level (Vdl) upon activation of the word line WL. The data levels on bit line BL and bit line-bar $\overline{\text{BL}}$ receive the memory cell voltage provided through transistors M1 and M6. Transistor M1 receives a voltage about equal to Vdh at the source-drain terminal coupled to the memory cell when a "1" is stored and correspondingly, transistor M6 receives a Ground-level voltage. As explained above, the precharge voltage on bit line BL and bit line-bar $\overline{\text{BL}}$ it is not great enough to upset or flip a memory cell and bit line BL and bit line-bar $\overline{\text{BL}}$ in turn take on voltage levels corresponding to the data stored in the memory cell.

For instance, bit line BL goes to about Vdh and bit line-bar $\overline{\text{BL}}$ goes to about Ground-level. With the Sense Amplifier 440 enabled by Vdl being applied on the read enable terminal Rd_enable, the memory cell voltages on bit line BL and bit line-bar $\overline{\text{BL}}$ are sensed by the Sense Amplifier 440 and the corresponding logic level is produced on the sense amplifier output terminal Output. The sense amplifier output terminal Output goes to, for example, a high-level voltage when the sense amplifier has stored a "1." Due to the differential nature of the Sense Amplifier 440 and corresponding differential nature of bit line BL and bit line-bar $\overline{\text{BL}}$, it is only necessary that a very small change in the voltages on bit line BL and bit line-bar $\overline{\text{BL}}$ be present to trigger the Sense Amplifier 440. At the conclusion of the read operation the levels for the read_enable signal applied to Rd_enable and the word line select signal are complemented and Ground is applied to the precharge terminal Prech. The bit line drivers 470, 475 are not involved in the Read Operation and their respective data inputs may be at any level (i.e., a "don't care" condition) during the Read Operation.

Figure 6:
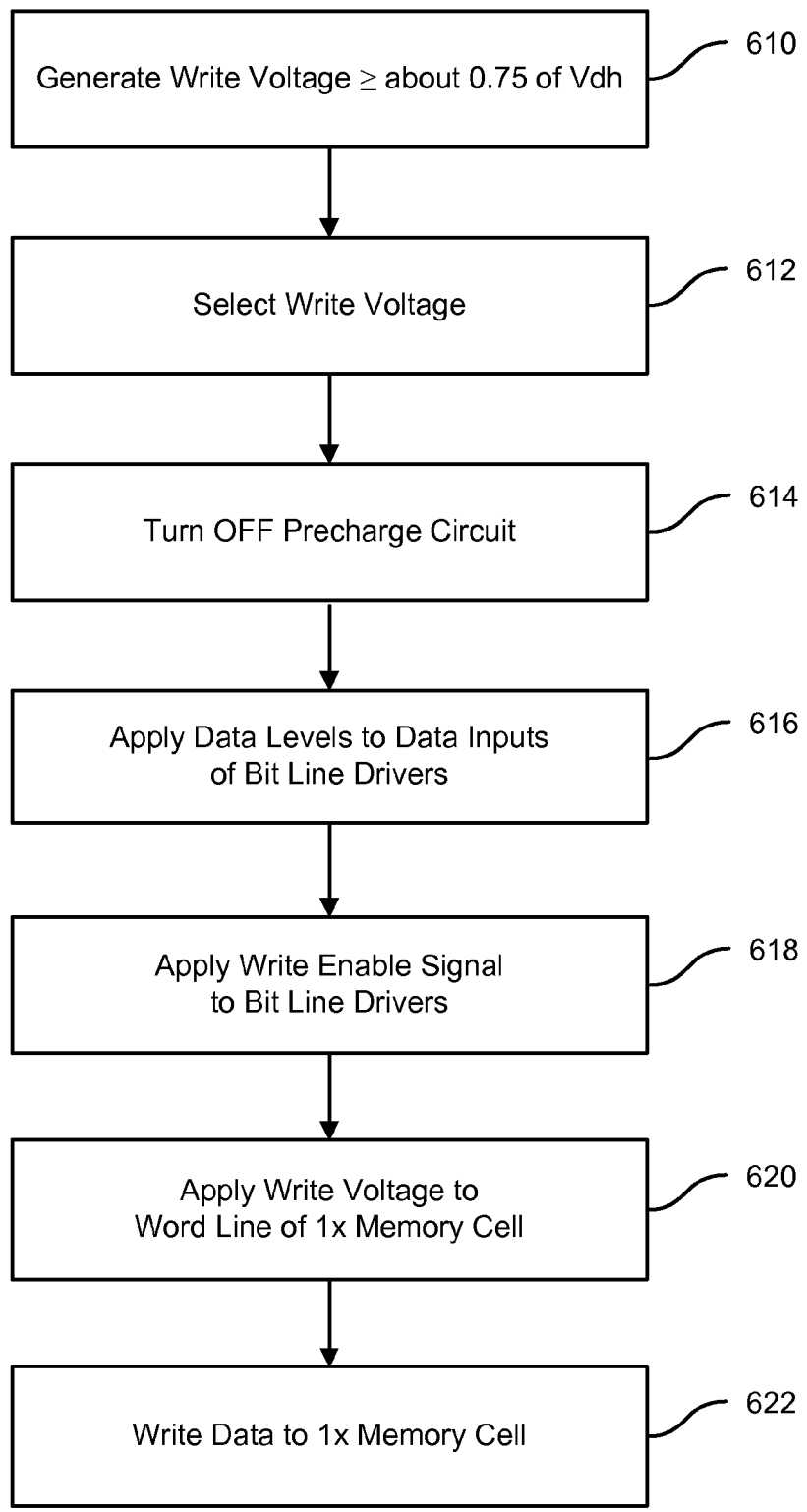
FIG. 6 is a simplified flowchart of a method of writing a value to a memory cell according to an embodiment of the present invention.

FIG. 6 is a simplified flowchart of a method of writing a value to a memory cell according to an embodiment of the present invention. The method of writing a value to the memory cell commences with generating a write voltage greater than about 0.75 Vdh 610 and (as stated above) less than or equal to Vdh. The write voltage may be supplied, for example, by any available voltage source within an accompanying system, where the voltage source lies within the accepted range of write voltage. The write voltage may be explicitly generated from combinations of active and passive devices used to take as input, for example, an available high-level supply voltage and derive an appropriate write voltage level. Precision resistors, current mirrors, and source followers may be used in combinations, as is common in the art, to provide the write voltage from a supply voltage source.

Another step in the method is selecting the write voltage 612 with the multiplexer 452 (FIG. 4). Selection of the write voltage is accomplished by applying a corresponding logic level (Vdl) to the multiplexer selection terminal Sel to select a conductive path, corresponding to Vwrt, from the voltage regulator 450, through the multiplexer 452, to node 454. An additional step in the method is turning OFF the precharge circuit 614 by withdrawing an assertive logic level on the precharge node Prech. In the present exemplary embodiment, the precharge circuit 430 is deactivated by applying a high-level logic value, for example Vdl, to the precharge node Prech (FIG. 5).

Another step in the method of writing a value to a memory cell is applying data levels to the data inputs of the bit line drivers 616. Data is applied in a true/complement configuration to the data inputs Di and $\overline{\text{Di}}$ of the bit line drivers 470, 475. A further step in the method is applying the write enable to the bit line drivers 618. In accordance with the present exemplary embodiment, the write enable signal is the write enable-bar signal $\overline{\text{Wrt\_enable}}$. Being an active-low level signal, means that when the write enable-bar signal $\overline{\text{Wrt\_enable}}$ is, for example, a value of 0 V, the line drivers 470, 475 are activated. The bit line drivers 470, 475 are supplied with, for example, the low-level Vdd (Vdl). Vdl of about, for example, 3 V and 0 V are applied to bit line and bit line-bar $\overline{\text{BL}}$ appropriately to correspond with either a "1" or "0."

A further step in the method is to apply the write voltage to the word line of the 1× memory cell 620. A word line select signal (not shown) is applied (WL_sel) to the word line select amplifier 462 (word line driver 460) and the write voltage Vwrt on node 454 is applied to the word line WL. The word line WL provides Vwrt to the gate terminals of NMOS transistors M1, M6.

The method also includes writing data to the 1× memory cell 622. With the NMOS transistors M1, M6 activated by Vwrt applied to their gate terminals, access is provided to the latch loop from bit line BL and bit line-bar $\overline{\text{BL}}$. The data levels produced on bit line BL and bit line-bar $\overline{\text{BL}}$ by the line drivers 470, 475 is provided to the 6T SRAM cell 410 and a corresponding "1" or "0" is stored in the latch loop.

It should be appreciated that the specific steps illustrated in FIG. 6 provide a particular method of writing a value to a memory cell according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
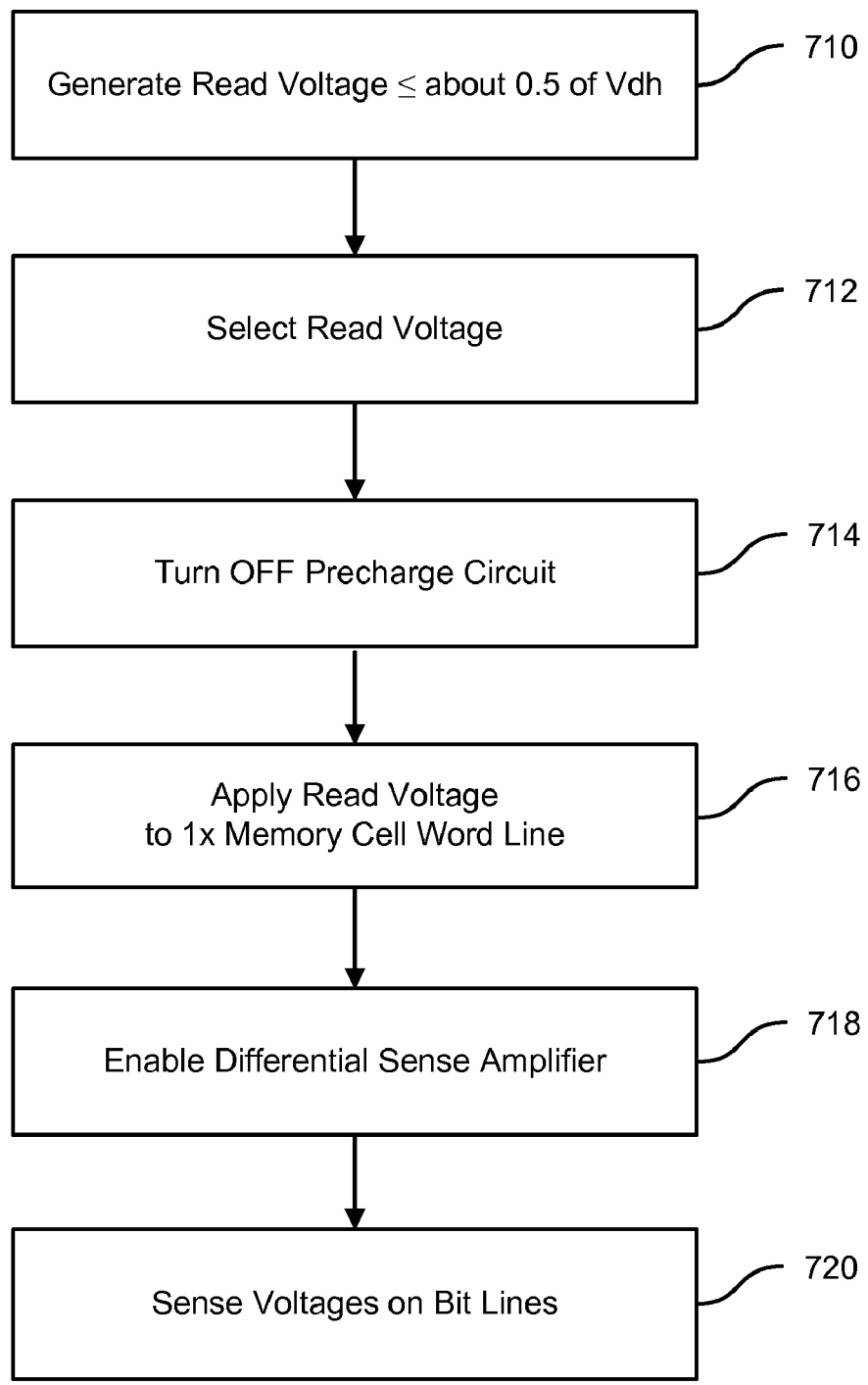
FIG. 7 is a simplified flowchart of a method of reading a value stored in a memory cell according to an embodiment of the present invention.

FIG. 7 is a simplified flowchart of a method of reading a value stored in a memory cell according to an embodiment of the present invention. The method of reading a value from the memory cell commences with generating a read voltage less than or about equal to half of Vdh 710. The read voltage Vrd may be supplied, for example, by any available voltage source within an accompanying system, where the voltage source lies within the range of read voltage. The read voltage Vrd may be explicitly generated from combinations of active or passive devices used to take as input, for example, an available high-level supply voltage and derive an appropriate read voltage level. Precision resistors, current mirrors, and source followers may be used in combinations, as is common in the art, to provide the read voltage Vrd from a supply voltage source.

Another step in the method of reading a stored value is selecting the read voltage 712 with the multiplexer 452 (FIG. 4). Selection of the read voltage is accomplished by applying a logic level (Ground) to the select line Sel of the multiplexer 452 to select a conductive path, corresponding to the Vrd, from the voltage regulator 450, through the multiplexer 452, to node 454. A further step in the method is turning OFF the precharge circuit 714 by withdrawing an assertive logic level on the precharge node Prech. In the present exemplary embodiment, the precharge circuit 430 is deactivated by applying a high-level logic value, for example Vdl, to the precharge node Prech (FIG. 5).

A further step in the method is to apply the read voltage to the 1× memory cell word line 716. A word line select signal (not shown) is applied (WL_sel) to the word line select amplifier 462 (word line driver 460) and the read voltage Vrd on node 454 is applied to the word line WL. The word line WL provides Vrd to the gate terminals of NMOS transistors M1, M6.

Another step in the method of reading a stored value enables the differential sense amplifier 718. To enable the differential sense amplifier a high-level logic voltage is applied on the read enable terminal Rd_enable of the Sense Amplifier 440. A further step in the method includes sensing voltages on the bit line 720. After being enabled, the Sense Amplifier 440 senses the bit line voltages. A positive input terminal of the sense Amplifier 440 is coupled to bit line BL and a negative input terminal is coupled to bit line-bar $\overline{BL}$. The positive and negative input terminals sense the complementary signaling nature of data on bit line BL and bit line-bar $\overline{BL}$ to effect the sensing of data from the 6T SRAM cell 410.

It should be appreciated that the specific steps illustrated in FIG. 7 provide a particular method of reading a value stored in a memory cell according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple substeps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A memory cell for driving a complementary pair of electrodes associated with a micro-mirror of a spatial light modulator, the memory cell comprising:
   two PMOS transistors coupled to a voltage source providing a source voltage, wherein the two PMOS transistors are characterized by a first size;
   two NMOS transistors coupled to ground, each of the two NMOS transistors being coupled to one of the two PMOS transistors and characterized by a second size substantially equal to the first size;
   two word line transistors coupled to a word line and characterized by a third size substantially equal to the first size;
   a word line driver coupled to the word line;
   a multiplexer coupled to the word line driver; and
   a voltage supply coupled to the multiplexer and including a read voltage source providing a read voltage and a write voltage source providing a write voltage, wherein read voltage is less than the write voltage.

2. The memory cell of claim 1 wherein the write voltage is less than the source voltage.

3. A memory cell for driving a complementary pair of electrodes associated with a micro-mirror of a spatial light modulator, the memory cell comprising:
   a latch loop configured to retain either a first voltage associated with a logic level "1" or a second voltage associated with a logic level "0", wherein the latch loop comprises a pair of access transistors, wherein a first terminal of each of the pair of access transistors is coupled to the latch loop and a gate of each of the pair of access transistors is coupled to a word line;
   a word line driver coupled to the word line; and
   a voltage multiplexer coupled to the word line driver and configured to provide at least a read voltage and a write voltage to the word line.

4. The memory cell of claim 3 further comprising a voltage generator coupled to the voltage multiplexer and configured to generate a plurality of voltages.

5. The memory cell of claim 3 wherein the read voltage is less than half the write voltage.

6. The memory cell of claim 3 wherein the latch loop further comprises a pair of cross-coupled inverters, each of the pair of cross-coupled inverters further comprising a first transistor of a first conductivity type and a second transistor of a second conductivity type.

7. The memory cell of claim 6 wherein the first transistor of the first conductivity type comprises a PMOS transistor and the second transistor of the second conductivity type an NMOS transistor.

8. The memory cell of claim 7 wherein one of the access transistors, the PMOS transistor, and the NMOS transistor are characterized by a substantially same size.

9. A memory cell comprising:
   a latch loop configured to retain a plurality of logic states, wherein the latch loop comprises a pair of cross-coupled inverters;
   a pair of access transistors, wherein a first terminal of each of the pair of access transistors is coupled to the latch loop and a gate of each of the pair of access transistors is coupled to a word line, the pair of access transistors being characterized by a first gain associated with a reading of the plurality of logic states and a second gain associated with a writing of the plurality of logic states;

a word line driver coupled to the word line; and a voltage multiplexer coupled to the word line driver and configured to provide at least a read voltage and a write voltage, wherein the read voltage is less than the write voltage.

10. The memory cell of claim 9 wherein each of the pair of cross-coupled inverters further comprising a first transistor of a first conductivity type and a second transistor of a second conductivity type.

11. The memory cell of claim 10 wherein the first transistor of the first conductivity type comprises a PMOS transistor and the second transistor of the second conductivity type an NMOS transistor.

12. The memory cell of claim 11 wherein one of the access transistors, the PMOS transistor, and the NMOS transistor are characterized by a substantially same size.

13. The memory cell of claim 12 the substantially same size comprises a size associated with a minimum design rule transistor.

14. A memory cell comprising:

a pair of cross-coupled inverters, each of the pair of cross-coupled inverters being coupled to a first voltage source providing a high voltage and to a second voltage source providing a low voltage and each of the pair of cross-coupled inverters having a PMOS transistor and an NMOS transistor, a size of the NMOS transistor being less than or equal to twice a size of the PMOS transistor;

a pair of word line transistors, each of the pair of word line transistors being coupled between one of the pair of cross-coupled inverters and a word line, wherein a size of each of the pair of word line transistors is less than 150% of the size of the PMOS transistor; and a multiplexer coupled to the word line and selectable to alternately provide a write voltage or a read voltage to the word line, the write voltage being greater than or equal to ¾ of the high voltage and the read voltage being less than ½ the high voltage.

15. The memory cell of claim 14 wherein the size of the NMOS transistor is less than or equal to 1.5 times the size of the PMOS transistor.

16. The memory cell of claim 15 wherein the size of each of the pair of word line transistors, the size of the NMOS transistor, and the size of the PMOS transistor is within 40% of a same size.

17. The memory cell of claim 14 wherein the low voltage is ground.

18. A method of reading a value stored in a memory cell coupled to a power supply characterized by a high voltage, the method comprising:

providing a read voltage less than or approximately equal to half of the high voltage;

selecting the read voltage;

turning off a precharge circuit coupled to the memory cell through a bit line;

applying the read voltage to a word line of the memory cell;

enabling a differential sense amplifier coupled to the memory cell through the bit line; and sensing a voltage on the bit line.

19. The method of claim 18 wherein selecting the read voltage comprises applying a first logic level to a select line of a multiplexer coupled to the word line.

20. The method of claim 18 wherein the read voltage is greater than a device threshold of a word line transistor of the memory cell.

21. The method of claim 18 wherein a voltage source for the precharge circuit is less than the high voltage.

* * * * *